United States Patent
Oikawa

(10) Patent No.: US 11,926,891 B2
(45) Date of Patent: Mar. 12, 2024

(54) CLEANING METHOD AND PROCESSING APPARATUS

(71) Applicant: Tokyo Electron Limited, Tokyo (JP)

(72) Inventor: Masami Oikawa, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 105 days.

(21) Appl. No.: 17/644,868

(22) Filed: Dec. 17, 2021

(65) Prior Publication Data

US 2022/0223404 A1    Jul. 14, 2022

(30) Foreign Application Priority Data

Jan. 12, 2021    (JP) .................................. 2021-002979

(51) Int. Cl.
*C23C 16/44*    (2006.01)
(52) U.S. Cl.
CPC ................................. *C23C 16/4405* (2013.01)
(58) Field of Classification Search
None
See application file for complete search history.

(56) References Cited

U.S. PATENT DOCUMENTS

| | | | |
|---|---|---|---|
| 2004/0185670 A1* | 9/2004 | Hamelin ................ | C25D 11/02 257/E21.252 |
| 2011/0094636 A1* | 4/2011 | Takeda ................. | C21D 9/5737 266/259 |
| 2014/0116251 A1* | 5/2014 | Bade ................... | B01D 53/1475 95/156 |
| 2017/0260626 A1* | 9/2017 | Nagato ............. | H01L 21/02164 |

FOREIGN PATENT DOCUMENTS

JP    2004-172409    6/2004

* cited by examiner

*Primary Examiner* — Nicole Blan
(74) *Attorney, Agent, or Firm* — IPUSA, PLLC

(57) ABSTRACT

A cleaning method for removing a silicon-containing film deposited in a temperature-adjustable process container by a heater and a cooler includes: stabilizing a temperature in the process container to a cleaning temperature; and removing the silicon-containing film by supplying a cleaning gas into the process container stabilized at the cleaning temperature; wherein in the removing the silicon-containing film, a heating capability of the heater and a cooling capability of the cooler are controlled based on the temperature in the process container.

8 Claims, 8 Drawing Sheets

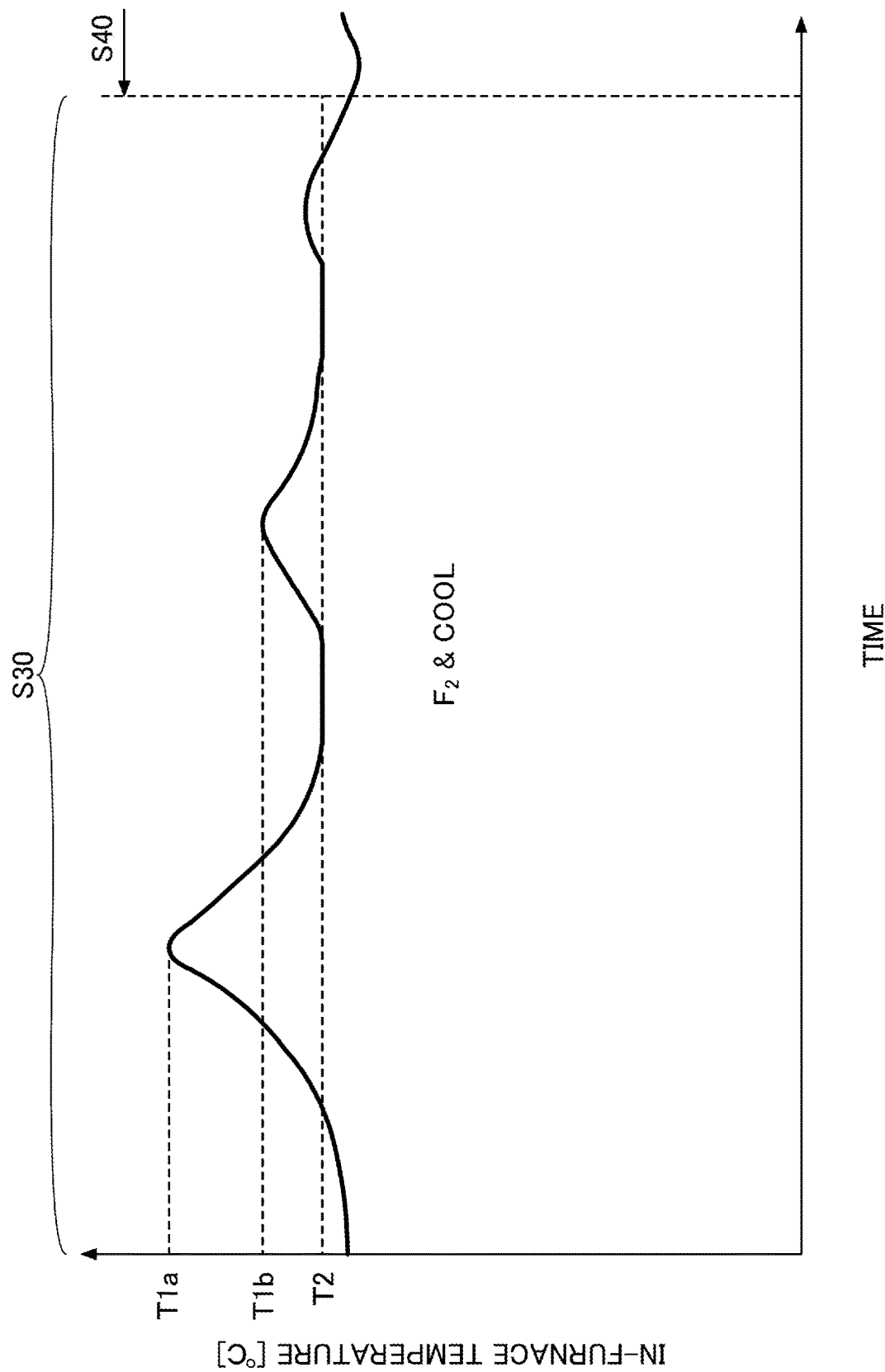

CLEANING METHOD AND PROCESSING APPARATUS

CROSS-REFERENCE TO RELATED APPLICATION

The present application is based upon and claims priority to Japanese Patent Application No. 2021-002979, filed on Jan. 12, 2021, and the entire contents of this application is incorporated herein by reference.

BACKGROUND

1. Field

The present disclosure relates to a cleaning method and a processing apparatus.

2. Background Art

In a processing apparatus that is used in a semiconductor process, when a film is formed on a substrate, a film is also deposited in the apparatus. Therefore, in such a processing apparatus, a cleaning process is performed by which a cleaning gas is supplied into a process container heated to a predetermined temperature to remove a film deposited in the apparatus (see, for example, Patent Document 1). In Patent Document 1, the temperature in a reaction container is detected while a cleaning gas containing fluorine is supplied into the reaction container, and the supply of the cleaning gas is stopped based on the detected temperature.

PRIOR ART DOCUMENTS

Patent Documents

[Patent Document 1] Japanese Laid-open Patent Publication No. 2004-172409

The present disclosure provides a technique that can reduce damage to a quartz member when removing a silicon-containing film.

SUMMARY

According to one aspect of the present disclosure, a cleaning method for removing a silicon-containing film deposited in a temperature-adjustable process container by a heater and a cooler includes: stabilizing a temperature in the process container to a cleaning temperature; and removing the silicon-containing film by supplying a cleaning gas into the process container stabilized at the cleaning temperature; wherein in the removing the silicon-containing film, a heating capability of the heater and a cooling capability of the cooler are controlled based on the temperature in the process container.

According to the present disclosure, it is possible to reduce damage to a quartz member when removing a silicon-containing film.

BRIEF DESCRIPTION OF THE DRAWINGS

FIG. 8 is a diagram illustrating still another example of the cleaning step.

DESCRIPTION OF THE EMBODIMENTS

Figure 1:
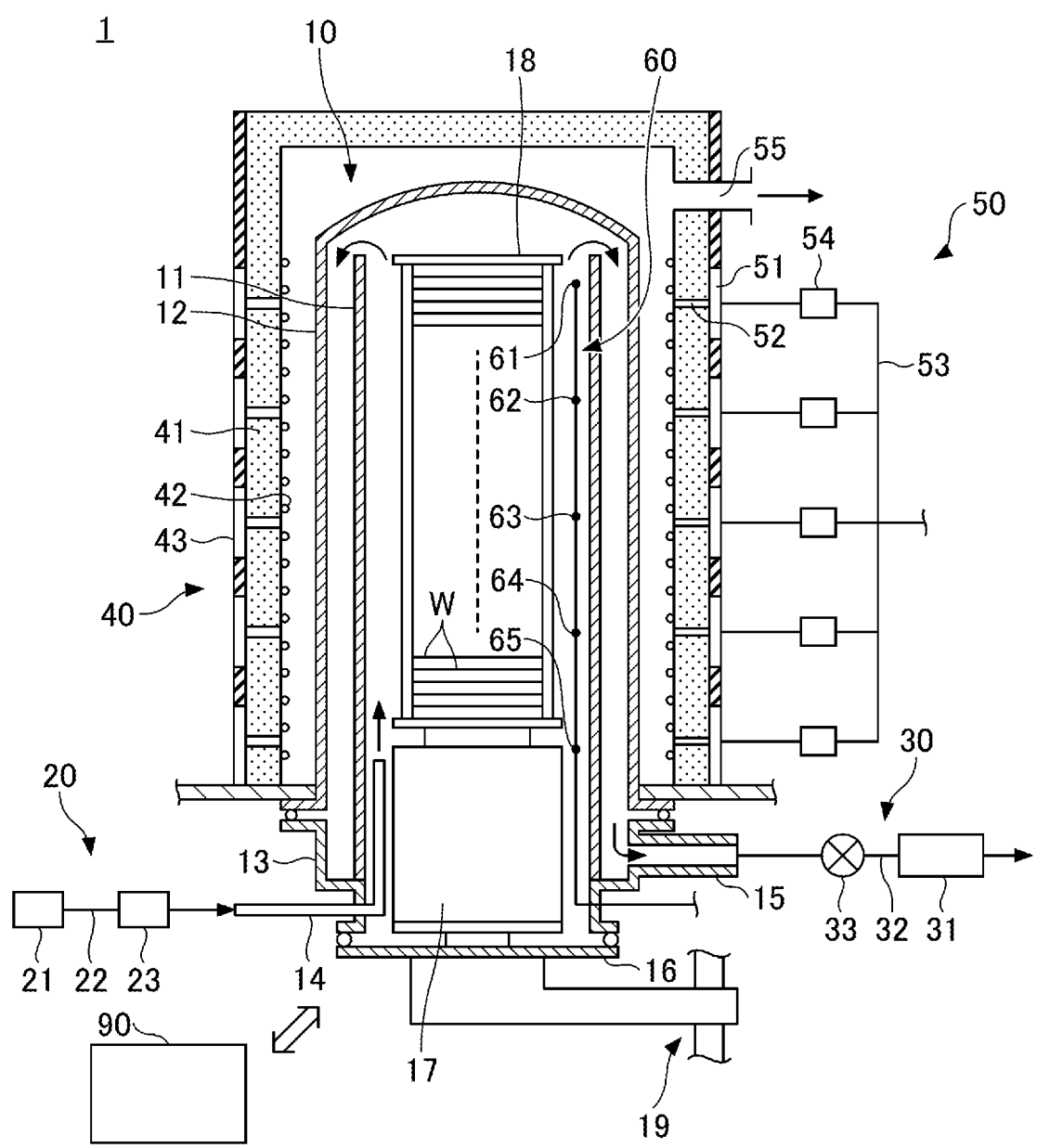
FIG. 1 is a schematic diagram illustrating an example of a processing apparatus according to an embodiment.

In the following, non-limiting exemplary embodiments of the present disclosure will be described with reference to the accompanying drawings. In all the accompanying drawings, the same or corresponding reference numerals shall be attached to the same or corresponding members or components and overlapping descriptions may be omitted.

[Processing Apparatus]

Referring to FIG. 1, an example of a processing apparatus according to an embodiment will be described. FIG. 1 is a schematic diagram illustrating an example of a processing apparatus 1 according to an embodiment.

The processing apparatus 1 includes a process container 10, a gas supply section 20, an exhaust section 30, a heater 40, a cooler 50, a temperature sensor 60, a controller 90, and the like.

The process container 10 has a generally cylindrical shape. The process container 10 includes an inner pipe 11, an outer pipe 12, a manifold 13, an injector 14, a gas outlet 15, a lid 16, and the like.

The inner pipe 11 has a generally cylindrical shape. The inner pipe 11 is formed of a heat-resistant material such as quartz. The inner pipe 11 is also referred to as an inner tube.

The outer pipe 12 has a generally cylindrical shape with a ceiling and is concentrically provided around the inner pipe 11. That is, the inner pipe 11 and the outer pipe 12 form a double pipe structure. The outer pipe 12 is formed of a heat-resistant material such as quartz. The outer pipe 12 is also referred to as an outer pipe.

The manifold 13 has a generally cylindrical shape. The manifold 13 supports the lower ends of the inner pipe 11 and the outer pipe 12. The manifold 13 may be formed, for example, of stainless steel.

The injector 14 penetrates the manifold 13 to extend horizontally in the inner pipe 11, and bends in the inner pipe 11 to extend upward in an L-shaped manner. The injector 14 has a base end connected to a gas supply pipe 22, which will be described later below, and a tip that is opened. The injector 14 discharges a process gas, introduced through the gas supply pipe 22, from the opening at the tip into the inner pipe 11. Examples of the process gas may include a deposition gas, a cleaning gas, and a purge gas. In the present embodiment, the deposition gas is a gas used to deposit a silicon-containing film. Examples of the deposition gas may include a silicon-containing gas, a nitride gas, an oxide 2' gas, and a doping gas. Examples of the silicon-containing film may include a silicon film, a silicon nitride film, and a silicon oxide film. Examples of the silicon film may include an amorphous silicon (a-Si) film, a polysilicon (Poly-Si) film, and a doped silicon (Doped-Si) film. The cleaning gas is a gas used to perform a cleaning method, which will be described later below. Examples of the cleaning gas may include halogen-containing gases such as $F_2$ gas, $Cl_2$ gas, $ClF_3$ gas, $NF_3$ gas, and HF gas. The purge gas is a gas for replacing the atmosphere in the process container 10 with an inert gas atmosphere. Examples of the purge gas may include an inert gas such as $N_2$ gas and Ar gas. In the example of FIG. 1, a single injector 14 is illustrated, but a plurality of injectors 14 may be used.

The gas outlet 15 is formed in the manifold 13. The gas outlet 15 is connected to an exhaust pipe 32, which will be described later. The process gas supplied into the process container 10 is evacuated by the exhaust section 30 through the gas outlet 15.

The lid 16 airtightly seals the opening at the lower end of the manifold 13. The lid 16 is formed, for example, of stainless steel. A wafer boat 18 is mounted on the lid 16 via a heat insulation cylinder 17. The heat insulation cylinder 17 and the wafer boat 18 may be formed of a heat resistant material such as quartz, for example. The wafer boat 18 holds a plurality of wafers W generally horizontally with predetermined intervals in the vertical direction. The wafer boat 18 is carried (loaded) into the process container 10 by a lifting and lowering mechanism 19 lifting the lid 16 and is accommodated in the process container 10. The wafer boat 18 is carried out (unloaded) from the process container 10 by the 2' lifting and lowering mechanism 19 lowering the lid 16.

The gas supply section 20 includes a gas source 21, a gas supply pipe 22, and a flow rate controller 23. The gas source 21 is the source of the process gas and includes, for example, a deposition gas source, a cleaning gas source, and a purge gas source. The gas supply pipe 22 connects the gas source 21 to the injector 14. The flow controller 23 is disposed on to control the flow rate of the gas that flows through the gas supply pipe 22. The flow rate controller 23 includes, for example, a mass flow controller and an opening/closing valve. The gas supply section 20 controls the flow rate of the process gas from the gas source 21 by the flow rate controller 23 and supplies the process gas to the injector 14 via the gas supply pipe 22.

The exhaust section 30 includes an exhaust device 31, an exhaust pipe 32, and a pressure controller 33. For example, the exhaust device 31 is a vacuum pump such as a dry pump or a turbomolecular pump. The exhaust pipe 32 connects the gas outlet 15 to the exhaust device 31. The pressure controller 33 is disposed on the exhaust pipe 32 to control the pressure within the process container 10 by adjusting the conductance of the exhaust pipe 32. The pressure controller 33 may be, for example, an automatic pressure control valve.

The heater 40 includes a heat insulating material 41, a heating element 42, and a jacket 43. The heat insulating material 41 has a generally cylindrical shape and is provided around the outer pipe 12. The heat insulating material 41 is formed mainly of silica and alumina. The heating element 42 is linear and provided in a spiral or serpentine shape around the inner periphery of the heat insulating material 41. The heating element 2' 42 is configured to enable temperature control in a plurality of zones divided in the height direction of the process container 10. Hereinafter, the plurality of zones are referred to as "TOP", "C-T", "CTR", "C-B", and "BTM" in order from the top. The jacket 43 is provided to cover the outer periphery of the heat insulating material 41. The jacket 43 retains the shape of the heat insulating material 41 and reinforces the heat insulating material 41. The jacket 43 is formed of a metal such as stainless steel. A water-cooled jacket (not illustrated) may be provided around the outer periphery of the jacket 43 in order to suppress the thermal effect on the outside of the heater 40. The heater 40 heats the interior of the process container 10 by heat generation of the heating element 42.

The cooler 50 supplies a cooling fluid to the process container 10 and cools the wafers W in the process container 10. The cooling fluid may be, for example, air. For example, after a heat treatment, the cooler 50 supplies the cooling fluid to the process container 10 when rapidly cooling the wafers W. Also, the cooler 50 supplies the cooling fluid into the process container 10, for example, at the time of cleaning for removing a deposit film in the process container 10. The cooler 50 includes fluid flow paths 51, blowout holes 52, a distribution flow path 53, flow rate adjusters 54, and a heat exhaust port 55.

The plurality of fluid flow paths 51 are formed in the height direction between the heat insulating material 41 and the jacket 43. The fluid flow paths 51 may be, for example, flow paths formed along the circumferential direction on the outside of the heat insulating material 41.

The blowout holes 52 are formed penetrating the heat insulating material 41 from the respective fluid flow paths 51 and blow the cooling fluid into the space between the outer pipe 12 and the heat insulating material 41.

The distribution flow path 53 is provided outside the jacket 43, and distributes and supplies the cooling fluid to each fluid flow path 51.

The flow rate adjusters 54 are disposed on the distribution flow path 53 to adjust the flow rate of the cooling fluid supplied to the fluid flow paths 51.

The heat exhaust port 55 is provided above a plurality of blowout holes 52 to discharge the cooling fluid supplied to the space between the outer pipe 12 and the heat insulating material 41 to the outside of the processing apparatus 1. The cooling fluid discharged to the outside of the processing apparatus 1 is cooled, for example, by a heat exchanger, and supplied again to the distribution flow path 53. However, the cooling fluid discharged to the outside of the processing apparatus 1 may be discharged without being reused.

The temperature sensor 60 detects the temperature in the process container 10. The temperature sensor 60 is provided, for example, in the inner pipe 11. However, the temperature sensor 60 may be provided at a position where the temperature within the process container 10 can be detected. For example, the temperature sensor 60 may be provided in a space between the inner pipe 11 and the outer pipe 12. The temperature sensor 60 includes a plurality of temperature gauges 61 to 65 disposed at different positions in the height direction corresponding to a plurality of zones, for example. The temperature gauges 61 to 65 are provided corresponding to the respective zones "TOP", "C-T", "CTR", "C-B", and "BTM". The plurality of temperature gauges 61 to 65 may be, for example, thermocouples or temperature measuring resistors. The temperature sensor 60 transmits the temperature detected by the plurality of the temperature gauges 61 to 65 to the controller 90.

The controller 90 controls the operation of the processing apparatus 1. The controller 90 may be, for example, a computer. A computer program for performing the overall operation of the processing apparatus 1 is stored in a storage medium. The storage medium may be, for example, a flexible disk, a compact disk, a hard disk, a flash memory, a DVD, or the like.

Here, a cleaning gas is used when removing a silicon-containing film deposited in the process container 10 in the processing apparatus 1. The removal reaction of the silicon-containing film by the cleaning gas may generate reaction heat and increase the temperature in the process container 10. As the temperature in the process container 10 increases, the removal reaction of the silicon-containing film becomes easy to proceed, and reaction heat is further generated to increase the temperature in the process container 10. Thus, the removal reaction of the silicon-containing film may proceed in a state of a desired temperature or more, causing damage (etching) to a member, such as quartz, used in the process container 10. As a result, particles are generated due to a member such as quartz, or the life of the member such as quartz is shortened and replacement frequency is increased. Also, when the cleaning temperature is set to be low considering the reaction heat, the etching rate of the silicon-containing film is lowered, and the productivity deteriorates.

Figure 2:
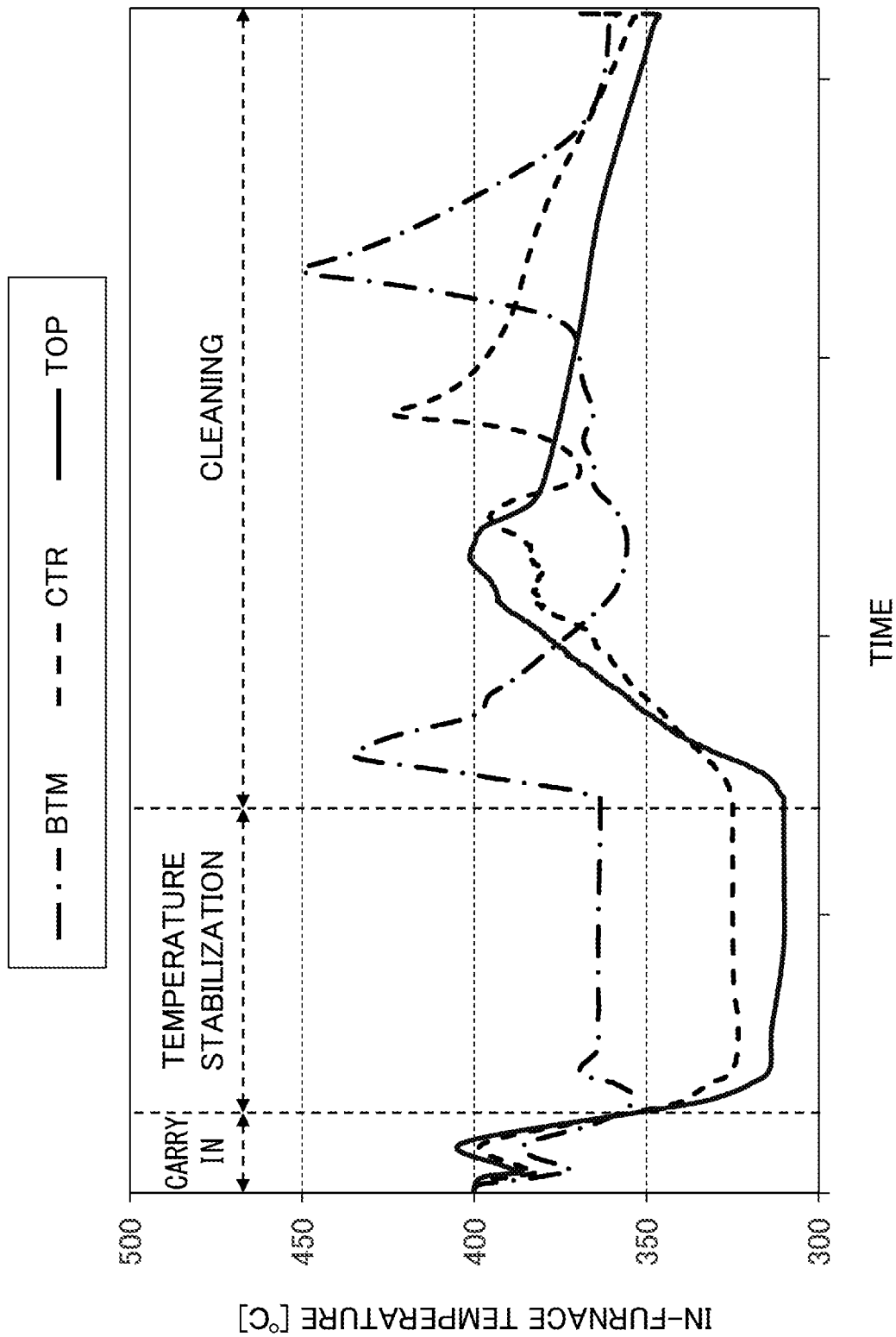
FIG. 2 is a diagram illustrating an example of a change in the temperature at the time of cleaning.

FIG. 2 is a diagram illustrating an example of a change in the temperature in the process container 10 (hereinafter referred to as the "in-furnace temperature") at the time of cleaning. FIG. 2 illustrates the change in the in-furnace temperature when the wafer boat 18 is carried into the process container 10 in which a silicon-film is deposited, $F_2$ gas is supplied into the process container 10 after the in-furnace temperature is stabilized, and the inside of the process container 10 is cleaned. In FIG. 2, the horizontal axis indicates time and the vertical axis indicates the in-furnace temperature [° C.]. In FIG. 2, the solid line, the broken line, and the dash-dotted line respectively indicate the in-furnace temperature at the top (TOP), the center (CTR), and the bottom (BTM) of the wafer boat 18.

As illustrated in FIG. 2, when the $F_2$ gas is supplied into the process container 10 after the temperature in the process container 10 is stabilized, it can be seen that the temperature in the process container 10 is increased in each of TOP, CTR and BTM. For example, for TOP, the in-furnace temperature increases from about 310° C. before the start of cleaning to about 400° C. Also, for CTR, the in-furnace temperature increases from about 325° C. before the start of cleaning to about 425° C. For BTM, the in-furnace temperature increases from about 360° C. before the start of cleaning to about 450° C.

Figure 3:
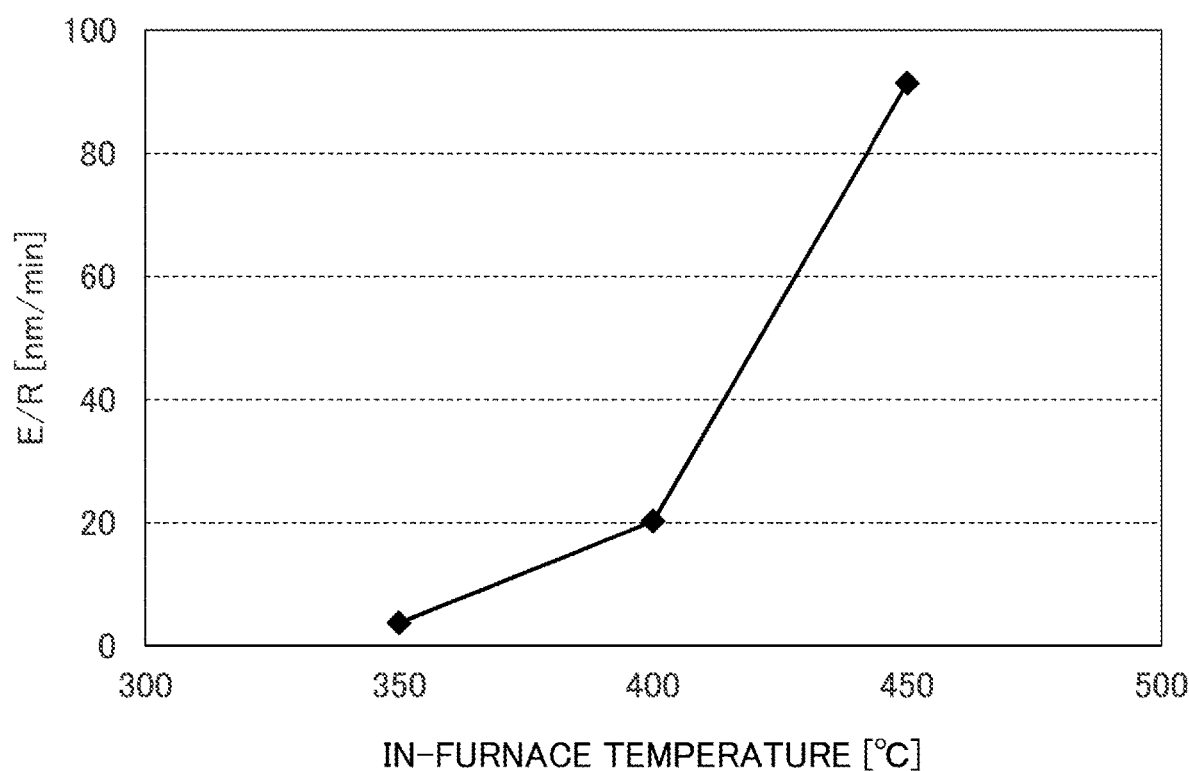
FIG. 3 is a diagram illustrating a temperature dependence of the etching rate of quartz.

FIG. 3 is a diagram illustrating a temperature dependence of the etching rate of quartz. FIG. 3 illustrates the etching rate (E/R) of quartz when $F_2$ gas is supplied into the process container 10 having the in-furnace temperature set to 350° C., 400° C., and 450° C. In FIG. 3, the horizontal axis indicates the in-furnace temperature [° C.] and the vertical axis indicates E/R [nm/min]. As illustrated in FIG. 3, E/R is about 3 nm/min 2' when the in-furnace temperature is 350° C., while E/R is about 20 nm/min when the in-furnace temperature is 400° C. When the in-furnace temperature is 450° C., E/R is about 90 nm/min.

Figure 4:
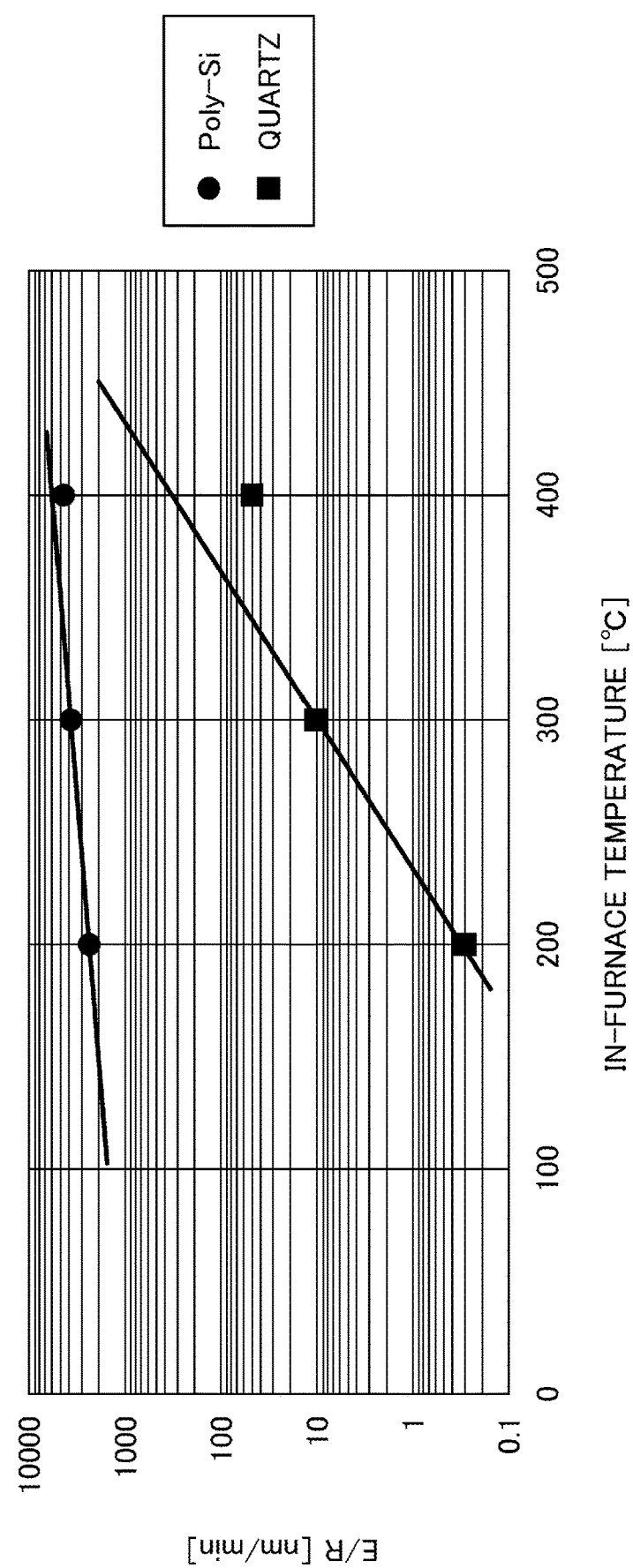
FIG. 4 is a diagram illustrating a temperature dependence of the etching rate for each of Poly-Si and quartz.

FIG. 4 is a diagram illustrating a temperature dependence of the etching rate for each of Poly-Si and quartz. FIG. 4 illustrates the etching rate (E/R) for each of Poly-Si and quartz when $F_2$ gas is supplied into the process container 10 having the in-furnace temperature set to 200° C., 300° C., and 400° C. In FIG. 4, the horizontal axis indicates the in-furnace temperature [° C.] and the vertical axis indicates E/R [nm/min]. As illustrated in FIG. 4, it can be seen that the lower the in-furnace temperature, the higher the selection ratio of Poly-Si to quartz.

As described above, from the results of FIG. 3 and FIG. 4, it can be seen that Poly-Si can be selectively removed with little etching of quartz when the in-furnace temperature is about 200° C. to about 350° C. On the other hand, it can be seen that when the in-furnace temperature is 400° C. or higher, the selection ratio of Poly-Si to quartz decreases and quartz is damaged.

Hereinafter, an example of a cleaning method according to an embodiment that can reduce damage to a quartz member when removing a silicon-containing film in the process container 10 will be described.

Cleaning Method

Figure 5:
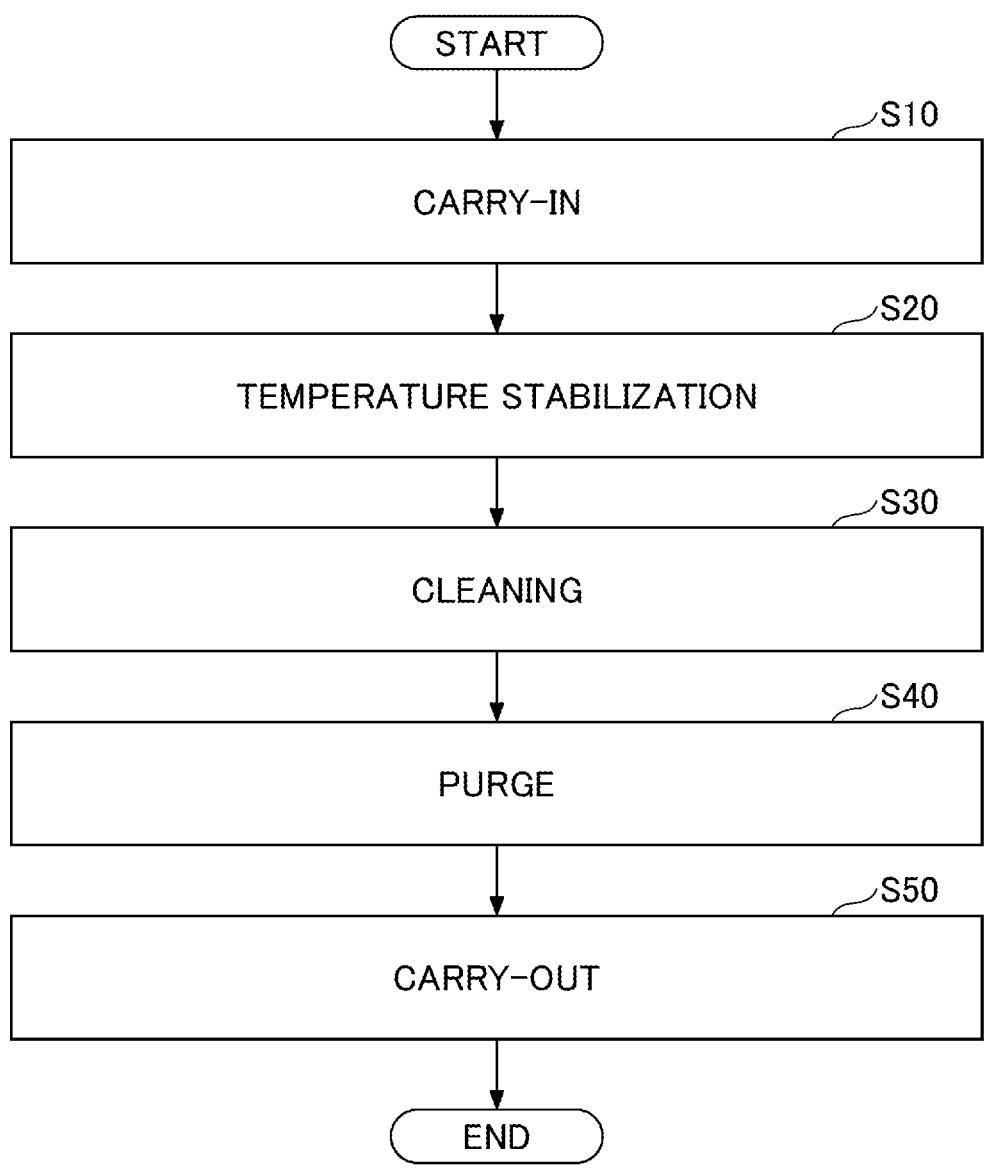
FIG. 5 is a flowchart illustrating an example of a cleaning method according to the embodiment.

Referring to FIG. 5, an example of a cleaning method of an embodiment will be described. Hereinafter, a case for removing a silicon-containing film deposited in the process container 10 by repeating a process of depositing the silicon-containing film on a wafer W in the above-described processing apparatus 1 will be described as an example.

The cleaning method of the embodiment includes a carry-in step S10, a temperature stabilization step S20, a cleaning step S30, a purge step S40, and a carry-out step S50.

The carry-in step S10 is a step of carrying the wafer boat 18 into the process container 10. In the carry-in step S10, the controller 90 controls the lifting and lowering mechanism 19 to lift the lid 16 to carry the lid 16 and the wafer boat 18 on the lid 16 into the process container 10. At this time, the temperature in the process container 10 is raised to the cleaning temperature by the heater 40. The cleaning temperature may be, for example, 300° C. to 350° C.

The temperature stabilization step S20 is performed after the carry-in step S10. In the temperature stabilization step S20, the controller 90 controls the heater 40 and the cooler 50 to stabilizes the temperature in the process container 10 to the cleaning temperature. In the temperature stabilization step S20, the controller 90 controls the gas supply section 20 to supply the purge gas into the process container 10 through the injector 14 and controls the exhaust section 30 to adjust the pressure in the process container 10 to the cleaning pressure.

The cleaning step S30 is performed after the temperature stabilization step S20. In the cleaning step S30, the controller 90 controls the gas supply section 20 to supply $F_2$ gas, which is an example of the cleaning gas, into the process container 10 stabilized at the cleaning temperature to remove the silicon-containing film.

Figure 6:
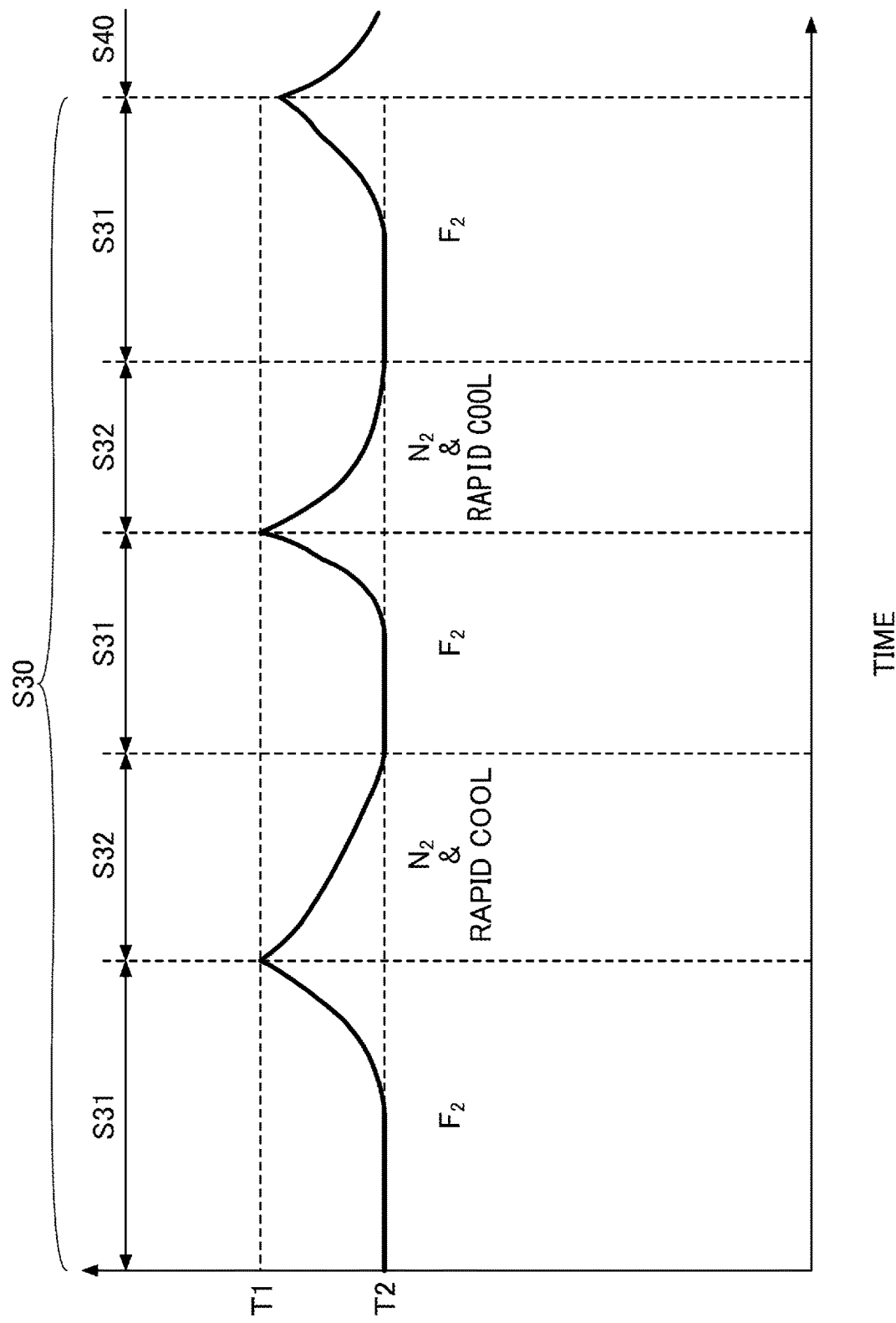
FIG. 6 is a diagram illustrating an example of a cleaning step.

FIG. 6 is a diagram illustrating an example of the cleaning step S30. The cleaning step S30 illustrated in FIG. 6 is a step for removing the silicon-containing film deposited in the process container 10 by repeating a cycle including a $F_2$ supply step S31 and a cooling step S32.

In the present embodiment, the controller 90 first executes the $F_2$ supply step S31, and when the temperature in the process container 10 becomes equal to or greater than the first temperature T1 in the $F_2$ supply step S31, the controller 90 transitions from the $F_2$ supply step S3 to the cooling step S32. Also, when the temperature in the process container 10 is less than or equal to the second temperature T2 in the cooling step S32, the controller 90 transitions from the cooling step S32 to the $F_2$ supply step S31.

The $F_2$ supply step S31 is a step of supplying the $F_2$ gas into the process container 10 without operating the cooler 50. In the $F_2$ supply step S31, the $F_2$ gas reacts with the silicon-containing film to generate reaction heat and raise the temperature in the process container 10.

The cooling step S32 is a step of operating the cooler 50 without supplying the $F_2$ gas into the process container 10 to increase the ratio of the cooling capacity of the cooler 50 to the heating capacity of the heater 40. In the cooling step S32, the temperature rise in the process container 10 due to reactive heat is suppressed because the $F_2$ gas is not supplied into the process container 10. Further, in the cooling step S32, the interior of the process container 10 is cooled because the cooler 50 is operated to increase the ratio of the cooling capacity of the cooler 50 to the heating capacity of the heater 40. In the cooling step S32, from the viewpoint of increasing the cooling efficiency, it is preferable to supply $N_2$ gas, which is an example of a purge gas, into the process container 10 to increase the pressure in the process container 10.

The first temperature T1 is set to, for example, 350° C. to 400° C. Thereby, it is possible to prevent a member such as quartz used in the process container 10 from being etched by the $F_2$ gas and damaged. The second temperature T2 is a temperature lower than the first temperature T1 and is set to, for example, 300° C. to 350° C.

According to the cleaning step S30 illustrated in FIG. 6, the silicon-containing film deposited in the process container 10 is removed by supplying the $F_2$ gas into the process container 10 until the temperature in the process container 10 rises to the first temperature T1. Subsequently, when the temperature in the process container 10 becomes greater than or equal to the first temperature T1, the supply of the $F_2$ gas into the process container 10 is stopped, the $N_2$ gas is supplied into the process container 10, and the ratio of the cooling capacity of the cooler 50 to the heating capacity of the heater 40 is increased. This cools the interior of the process container 10. As a result, the silicon-containing film in the process container 10 can be removed while preventing damage to members such as quartz used in the process container 10.

It should be noted that although three times of $F_2$ supply steps S31 and two times of cooling steps S32 are alternately performed in the above described example in FIG. 6, the number of times by which $F_2$ supply steps S31 and cooling steps S32 are performed is not limited thereto.

Figure 7:
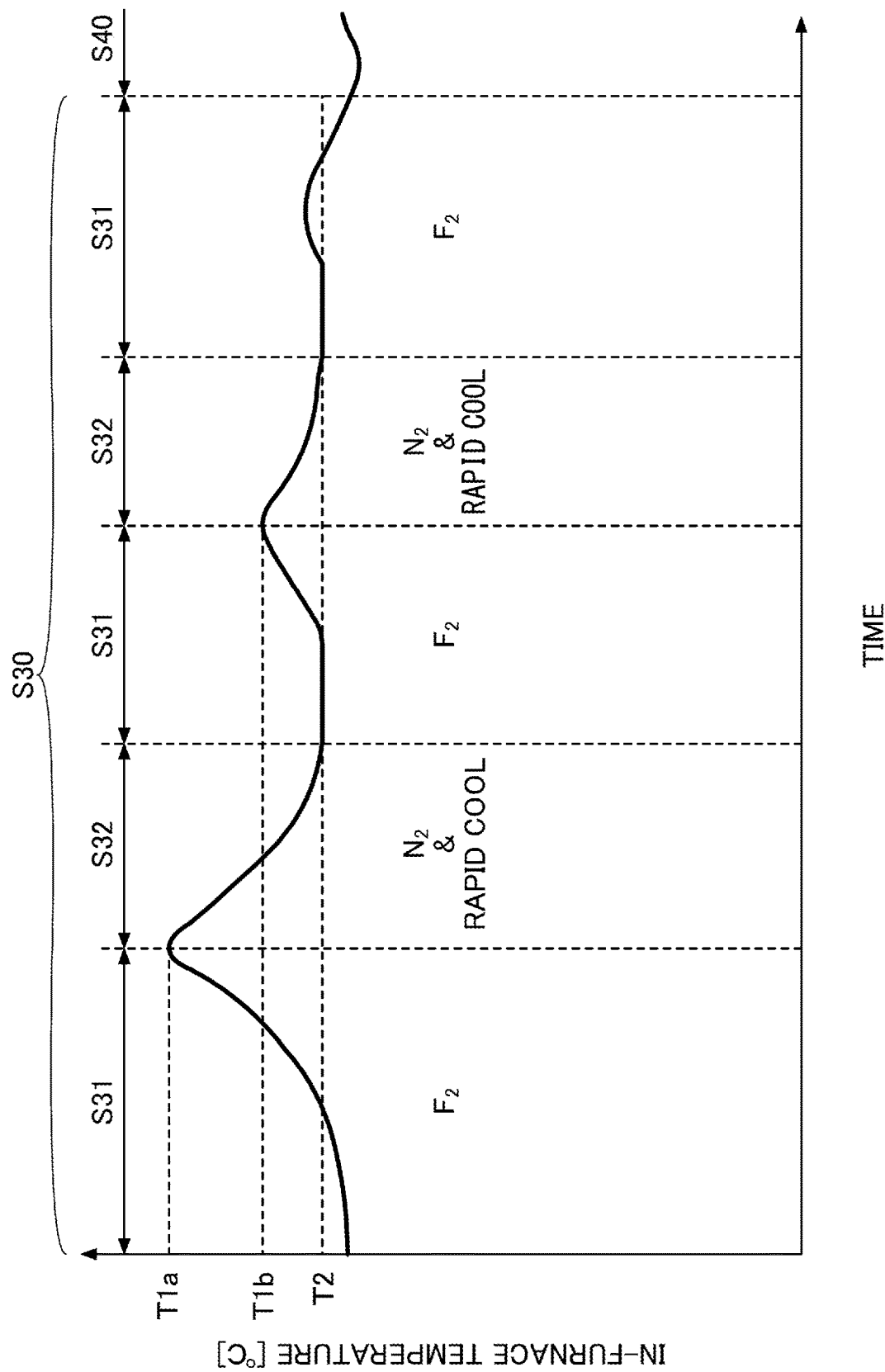
FIG. 7 is a diagram illustrating another example of the cleaning step.

FIG. 7 is a diagram illustrating another example of the cleaning step S30. In the cleaning step S30 illustrated in FIG. 7, the first temperature T1 used for determining the transition from the $F_2$ supply step S31 to the cooling step S32 is changed during the cycle. It should be noted that the other configurations may be the same as those of the cleaning step S30 illustrated in FIG. 6.

In the present embodiment, a first temperature T1$b$ at the time of the second transition from the $F_2$ supply step S31 to the cooling step S32 is changed to a temperature lower than a first temperature T1$a$ at the time of the first transition from the $F_2$ supply step S31 to the cooling step S32.

It should be noted that although the first temperature T1 used for determining the transition from the $F_2$ supply step S31 to the cooling step S32 is changed to a lower temperature as the number of cycles is increased in the example of FIG. 6, the first temperature T1 may be changed to a higher temperature as the number of cycles is increased, for example.

According to the cleaning step S30 illustrated in FIG. 7, the silicon-containing film deposited in the process container 10 is removed by supplying the $F_2$ gas into the process container 10 until the temperature in the process container 10 rises to the first temperature T1$a$, T1$b$. Subsequently, when the temperature in the process container 10 becomes greater than or equal to the first temperature T1$a$, T1$b$, the supply of the $F_2$ gas into the process container 10 is stopped, the $N_2$ gas is supplied into the process container 10, and the ratio of the cooling capacity of the cooler 50 to the heating capacity of the heater 40 is increased. This cools the interior of the process container 10. As a result, the silicon-containing film in the process container 10 can be removed while preventing damage to members such as quartz used in the process container 10.

It should be noted that although three times of $F_2$ supply steps S31 and two times of cooling steps S32 are alternately performed in the above described example in FIG. 7, the number of times by which $F_2$ supply steps S31 and cooling steps S32 are performed is not limited thereto.

FIG. 8 is a diagram illustrating another example of the cleaning step S30. The cleaning step S30 illustrated in FIG. 8 is a step for removing the silicon-containing film deposited in the process container 10 by operating the cooler 50 while supplying $F_2$ gas into the process container 10.

In the present embodiment, the controller 90 first controls the gas supply section 20 to supply the $F_2$ gas into the process container 10 via an injector 14 to remove the silicon-containing film deposited in the process container 10. At this time, when the $F_2$ gas reacts with the silicon-containing film, reaction heat is generated and the temperature in the process container 10 is raised. Subsequently, when the temperature in the process container 10 becomes equal to or greater than the first temperature T1$a$, the controller 90 cools the interior of the process container 10 by increasing the ratio of the cooling capacity of the cooler 50 to the heating capacity of the heater 40. Subsequently, when the temperature in the process container 10 becomes less than or equal to the second temperature T2, the controller 90 decreases the ratio of the cooling capacity of the cooler 50 to the heating capacity of the heater 40. Subsequently, when the temperature in the process container 10 becomes equal to or greater than the first temperature T1$b$, the controller 90 cools the interior of the process container 10 by increasing the ratio of the cooling capacity of the cooler 50 to the heating capacity of the heater 40. Subsequently, when the temperature in the process container 10 becomes less than or equal to the second temperature T2, the controller 90 decreases the ratio of the cooling capacity of the cooler 50 to the heating capacity of the heater 40. Thereafter, similarly, the silicon-containing film deposited in the process container 10 is removed while adjusting the ratio of the cooling capacity of the cooler 50 to the heating capacity of the heater 40.

According to the cleaning step S30 illustrated in FIG. 8, the silicon-containing film deposited in the process container 10 is removed by supplying the $F_2$ gas into the process container 10 until the temperature in the process container 10 rises to the first temperature T1$a$, T1$b$. Subsequently, when the temperature in the process container 10 becomes greater than or equal to the first temperature T1$a$, T1$b$, the controller 90 increases the ratio of the cooling capacity of the cooler 50 to the heating capacity of the heater 40 to cool the interior of the process container 10. Subsequently, when the temperature in the process container 10 becomes less than or equal to the second temperature T2, the controller 90 decreases the ratio of the cooling capacity of the cooler 50 to the heating capacity of the heater 40. Thereby, the silicon-containing film in the process container 10 can be removed while preventing damage to members such as quartz used in the process container 10.

The purge step S40 is performed after the cleaning step S30. The purge step S40 is a step of replacing the gas in process container 10. In the purge step S40, $N_2$ gas is supplied from the injector 14 into the process container 10 and the $F_2$ gas remaining in the process container 10 is replaced with the $N_2$ gas.

The carry-out step S50 is performed after the purge step S40. The carry-out step S50 is a step of carrying out the wafer boat 18 from within the process container 10. In the carry-out step S50, while operating the cooler 50 to rapidly cool the interior of the process container 10, by lowering the lid 16 by the lifting and lowering mechanism 19, the lid 16 and the wafer boat 18 are carried out from the interior of the process container 10.

The embodiment disclosed herein should be considered to be exemplary in all respects and not restrictive. The above embodiment may be omitted, substituted, or modified in various forms without departing from the appended claims and spirit thereof.

What is claimed is:

1. A cleaning method for removing a silicon-containing film deposited in a temperature-adjustable process container in which temperature is adjusted by a heater and a cooler, the cleaning method comprising:
stabilizing the temperature in the process container to a cleaning temperature; and
removing the silicon-containing film by supplying a cleaning gas into the process container stabilized at the cleaning temperature,
wherein in the removing the silicon-containing film, a heating capability of the heater and a cooling capability of the cooler are controlled based on the temperature in the process container,
wherein the removing the silicon-containing film includes
(a) supplying the cleaning gas into the process container without operating the cooler,
(b) operating the cooler without supplying the cleaning gas into the process container, and
(c) repeating a cycle including (a) and (b),
wherein when the temperature in the process container becomes equal to or higher than a first temperature in (a), (a) transitions to (b), and
wherein the first temperature is changed during the cycle.

2. The cleaning method according to claim 1, wherein when the temperature in the process container becomes equal to or less than a second temperature in (b), (b) transitions to (a).

3. The cleaning method according to claim 1, wherein an inert gas is supplied into the process container in (b).

4. The cleaning method according to claim 1, wherein the cleaning gas is a halogen-containing gas.

5. The cleaning method according to claim 1, wherein the process container is made of quartz and the cleaning gas is $F_2$ gas.

6. The cleaning method according to claim 1, wherein the cleaning temperature is 300° C. to 350° C.

7. A cleaning method for removing a silicon-containing film deposited in a temperature-adjustable process container in which temperature is adjusted by a heater and a cooler, the cleaning method comprising:
stabilizing the temperature in the process container to a cleaning temperature; and
removing, the silicon-containing film by supplying a cleaning gas into the process container stabilized at the cleaning temperature,
wherein in the removing the silicon-containing film, a heating capability of the heater and a cooling capability of the cooler are controlled based on the temperature in the process container,
wherein the removing the silicon-containing film includes
(a) supplying the cleaning gas into the process container while operating the cooler,
wherein the removing the silicon-containing film includes
increasing a ratio of the cooling capacity of the cooler to the heating capacity of the heater, in a case where the temperature in the process container becomes higher than or equal to a first temperature in (a),
decreasing the ratio in a case where the temperature in the process container becomes less than or equal to a second temperature that is less than the first temperature in (a), and
repeating a cycle including the increasing of the ratio and the decreasing of the ratio, and
wherein the first temperature is changed during the cycle.

8. A processing apparatus for depositing a silicon-containing film, the processing apparatus comprising:
a process container;
a gas supply section configured to supply a cleaning gas into the process container;
a heater configured to heat an interior of the process container;
a cooler configured to cool the interior of the process container;
a temperature sensor configured to detect a temperature in the process container; and
a controller,
wherein the controller is configured to execute
stabilizing the temperature in the process container to a cleaning temperature; and
removing the silicon-containing film by supplying the cleaning gas from the gas supply section into the process container stabilized at the cleaning temperature,
wherein in the removing the silicon-containing film, the controller is configured to control a heating capability of the heater and a cooling capability of the cooler based on the temperature detected by the temperature sensor,
wherein the removing the silicon-containing film includes
(a) supplying the cleaning gas into the process container without operating the cooler,
(b) operating the cooler without supplying the cleaning gas into the process container, and
(c) repeating a cycle including (a) and (b),
wherein when the temperature in the process container becomes equal to or higher than a first temperature in (a), (a) transitions to (b), and
wherein the first temperature is changed during the cycle.

* * * * *